(12) United States Patent
Marumoto

(10) Patent No.: US 7,516,065 B2
(45) Date of Patent: Apr. 7, 2009

(54) APPARATUS AND METHOD FOR CORRECTING A SPEECH SIGNAL FOR AMBIENT NOISE IN A VEHICLE

(75) Inventor: Toru Marumoto, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 949 days.

(21) Appl. No.: 10/861,109

(22) Filed: Jun. 4, 2004

(65) Prior Publication Data

US 2005/0015252 A1   Jan. 20, 2005

(30) Foreign Application Priority Data

Jun. 12, 2003 (JP) ............... 2003-167733
Mar. 3, 2004 (JP) ............... 2004-058302

(51) Int. Cl.
*G10L 21/02* (2006.01)
*G10L 11/02* (2006.01)

(52) U.S. Cl. .............. 704/215; 704/225; 704/226; 381/71.4

(58) Field of Classification Search ........... 704/210, 704/215, 225, 211, 226, 227; 381/71.4
See application file for complete search history.

(56) References Cited

U.S. PATENT DOCUMENTS

| | | | | |
|---|---|---|---|---|
| 4,811,404 A * | 3/1989 | Vilmur et al. | ............ | 381/94.3 |
| 4,933,973 A * | 6/1990 | Porter | ............ | 704/233 |
| 5,432,859 A * | 7/1995 | Yang et al. | ............ | 381/94.3 |
| 5,590,241 A * | 12/1996 | Park et al. | ............ | 704/227 |
| 5,749,068 A * | 5/1998 | Suzuki | ............ | 704/233 |
| 6,173,058 B1 * | 1/2001 | Takada | ............ | 381/66 |
| 6,529,605 B1 * | 3/2003 | Christoph | ............ | 381/56 |
| 6,542,864 B2 * | 4/2003 | Cox et al. | ............ | 704/212 |
| 6,990,206 B1 * | 1/2006 | Kowaki | ............ | 381/56 |
| 2004/0143433 A1 * | 7/2004 | Marumoto et al. | ............ | 704/225 |
| 2005/0013443 A1 * | 1/2005 | Marumoto et al. | ............ | 381/56 |
| 2006/0002568 A1 * | 1/2006 | Cuddihy et al. | ............ | 381/71.4 |
| 2007/0019825 A1 * | 1/2007 | Marumoto et al. | ............ | 381/94.1 |
| 2007/0265839 A1 * | 11/2007 | Sasaki et al. | ............ | 704/201 |

FOREIGN PATENT DOCUMENTS

| | | |
|---|---|---|
| JP | 05-198089 | 8/1993 |
| JP | 08-006575 | 1/1996 |
| JP | 09-185383 | 7/1997 |
| JP | 10-335960 | 12/1998 |
| JP | 11-166835 | 6/1999 |

* cited by examiner

*Primary Examiner*—Martin Lerner
(74) *Attorney, Agent, or Firm*—Brinks Hofer Gilson & Lione

(57) ABSTRACT

A speech correction apparatus includes a speaker for generating guidance speech; a microphone set at a hearing position; an acoustic-characteristic setting unit for separating ambient noise from the guidance speech at the hearing position; an operating unit; a speech correcting filter for correcting the sound pressure level of the guidance speech generated by the speaker based on the average power of the guidance speech and the average power of the ambient noise which are separated; a loudness-compensating-gain calculating unit; and a speech-head correcting unit for correcting the average power of the guidance speech corresponding to the speech head at the border between a silent state and a speech state of the guidance speech.

26 Claims, 12 Drawing Sheets

APPARATUS AND METHOD FOR CORRECTING A SPEECH SIGNAL FOR AMBIENT NOISE IN A VEHICLE

BACKGROUND OF THE INVENTION

1. Field of the Invention

The present invention relates to a speech correction apparatus for correcting a signal level of guidance speech or the like produced from a car-mounted navigation system in accordance with ambient noise.

2. Description of the Related Art

In general, guidance speech produced from a car-mounted navigation system is hard to hear depending on sound pressure levels of sounds generated from a car audio system or engine sound. The guidance speech can be heard more easily by reducing the volume of the audio system when the guidance speech is provided. In this method, however, the volume of sound from the audio system must be reduced every time the guidance speech is frequently produced, and the user will find it inconvenient. Further, such measures cannot be applied for an uncontrollable sound source, such as engine sound. The user will find it convenient if he/she can understand the guidance speech without reducing the volume of sound from the audio system. In order to satisfy such a requirement, a speech correction apparatus using a loudness compensating technique based on an auditory sense theory has been known (for example, see Japanese Unexamined Patent Application Publication No. 11-166835 (pp. 3 to 7 and FIGS. 1 to 10)). In this speech correction apparatus, a microphone is set at a hearing position and the gain of output speech is corrected according to the noise level at the hearing position. Accordingly, the user can clearly understand the speech regardless of the noise level.

In the speech correction apparatus disclosed in the above-identified Patent Document, the sound pressure level of each of guidance speech produced from a navigation system and ambient noise such as sounds from an audio system is detected so as to determine the gain for amplifying the guidance speech. The sound pressure level is actually detected by averaging the power of guidance speech and ambient noise at the time period just before determining the gain over a predetermined time period. Therefore, at the head portion of the guidance speech, the sound pressure level of the guidance speech is averaged over the predetermined time period, the sound pressure level is wrongly detected at a lower value than the actual value, and thus the sound pressure level at the head portion is excessively corrected disadvantageously.

FIGS. 15A and 15B show an example of excessive correction of a speech head. FIG. 15A shows a waveform of guidance speech to be corrected. FIG. 15B shows a waveform of guidance speech whose gain has been corrected by using the known speech correction apparatus disclosed in the above-identified Patent Document. As can be seen in the figures, the head portion of the guidance speech is excessively corrected and a pulse-like waveform appears.

In the speech correction apparatus disclosed in the Patent Document, guidance speech at the microphone position is estimated by using an adaptive filter. Usually, each filter coefficient of the adaptive filter is set at 0 in the initial state just after power-on, and then the filter coefficient is updated. In the initial state or just after the initial state, the power of guidance speech estimated by using the adaptive filter is much smaller than the actual value. Accordingly, the sound pressure level of the head portion corresponding to the filter coefficient in the initial state is excessively corrected disadvantageously.

SUMMARY OF THE INVENTION

The present invention has been made in view of these circumstances, and an object of the present invention is to provide a speech correction apparatus which prevents excessive correction of a head portion of speech.

In order to solve the above-described problems, a speech correction apparatus of the present invention includes a speaker for generating speech to be corrected; a microphone set at a hearing position; a signal separating unit for separating ambient noise from the speech to be corrected at the hearing position; a speech correcting unit for correcting a sound pressure level of the speech to be corrected based on an average power of the speech to be corrected and an average power of the ambient noise, which are separated by the signal separating unit; and a speech-head correcting unit for correcting an average power of a speech head at the border between a silent state and a speech state in the speech to be corrected. By adjusting the average power calculated for the head portion of the speech to be corrected, an excessive correction of the head portion of the speech to be corrected, which is caused when the average power is not adjusted, can be prevented.

Preferably, a time length Ls for calculating the average power of the speech to be corrected is longer than a time length Ln for calculating the average power of the ambient noise. Under this condition, the power of the head portion of the speech to be corrected is averaged together with a silent portion, and the estimated power becomes much smaller than the actual value. In such a case, by adjusting the average power, an excessive correction of the head portion of the speech to be corrected can be prevented more effectively.

Also, the speech-head correcting unit preferably multiplies the average power of the speech to be corrected by Ls/Ln for the time length Ln just after shifting from the silent state to the speech state at the speech head. Accordingly, an error caused by the difference between periods for calculating the average power of the speech to be corrected and ambient noise can be corrected.

Preferably, the speech-head correcting unit sequentially reduces the correction amount of the average power of the speech to be corrected after the time length Ln has passed until the time length Ls passes, with the border between the silent state and the speech state at the speech head being the reference. Accordingly, an unnatural connection in the guidance speech at the border between a portion in which the average power is corrected and a portion in which the average power is not corrected can be prevented.

A speech correction apparatus of the present invention includes a speaker for generating speech to be corrected; a microphone set at a hearing position; a signal separating unit for separating ambient noise from the speech to be corrected at the hearing position; a speech correcting unit for correcting a sound pressure level of the speech to be corrected based on an average power of the speech to be corrected and an average power of the ambient noise, which are separated by the signal separating unit; and a speech-head correcting unit for stopping correction of the sound pressure level which is performed by the speech correcting unit in accordance with a speech head at the border between a silent state and a speech state in the speech to be corrected. By stopping correction of the sound pressure level for the head portion of the speech to be corrected, an excessive correction of the speech caused at the head portion can be prevented.

Preferably, a time length Ls for calculating the average power of the speech to be corrected is longer than a time length Ln for calculating the average power of the ambient noise. Under this condition, the power of the head portion of the speech to be corrected is averaged together with a silent portion, and the estimated power becomes much smaller than the actual value. In such a case, by avoiding correction of the head portion of the speech to be corrected, an excessive correction of the head portion can be prevented more effectively.

The signal separating unit preferably includes a filter having an acoustic characteristic as an impulse response of the acoustic system between the speaker and the microphone; and an operating unit for subtracting a signal which is obtained by passing a signal provided to the speaker according to the speech to be corrected through the filter from a signal produced from the microphone when the speech to be corrected is generated by the speaker. Also, a signal corresponding to the speech to be corrected is supplied from the filter and a signal corresponding to the ambient noise is supplied from the operating unit. With this arrangement, the average power of each of the speech to be corrected and the ambient noise can be calculated separately, and thus the sound pressure level of the speech to be corrected can be corrected by using the loudness compensating technique.

Preferably, the speech correction apparatus further includes an identifying unit for identifying the acoustic characteristic of the filter. With this configuration, an optimal acoustic characteristic can be identified so as to set the filter every time the speaker setting position or the hearing position of the speech to be corrected changes.

The above-described identifying unit is a coefficient update unit for updating a filter coefficient of the filter so that the power of the signal supplied from the operating unit is minimized. Also, the apparatus further includes a filter initial setting unit for setting an initial value of the filter coefficient, which is updated by the coefficient update unit, at a value other than 0. With this configuration, the average power of the speech to be corrected is not underestimated during a time period from the initial state of the filter until the filter coefficient is gradually updated from 0 so as to reach some value. Accordingly, an excessive correction of the sound pressure level of the speech head can be prevented.

A speech correction apparatus of the present invention includes a speaker for generating speech to be corrected; a microphone set at a hearing position; a signal separating unit including a filter having an acoustic characteristic as an impulse response of the acoustic system between the speaker and the microphone, and an operating unit for subtracting a signal which is obtained by passing a signal supplied to the speaker according to the speech to be corrected through the filter from a signal supplied from the microphone when the speech to be corrected is produced from the speaker, a signal corresponding to the speech to be corrected being supplied from the filter and a signal corresponding to the ambient noise being supplied from the operating unit, so that the ambient noise is separated from the speech to be corrected at the hearing position; a coefficient update unit for updating a filter coefficient of the filter so that the power of the signal supplied from the operating unit is minimized; a filter initial setting unit for setting an initial value of the filter coefficient, which is updated by the coefficient update unit, at a value other than 0; and a speech correcting unit for correcting a sound pressure level of the speech to be corrected based on an average power of the speech to be corrected and an average power of the ambient noise, which are separated by the signal separating unit. By using a value other than 0 as the initial value of the filter coefficient, the average power of the signal supplied from the filter has a predetermined value larger than 0 from the initial state. Therefore, it can be prevented that a calculated average power of the speech to be corrected gradually increases from 0. Accordingly, an excessive correction of the sound pressure level of the speech head corresponding to the initial state can be prevented.

Preferably, the initial value set by the filter initial setting unit is a filter coefficient corresponding to a representative car model, which is determined based on the statistical number of cars for sale. Accordingly, the possibility of setting an initial value close to an ideal filter coefficient can be increased.

Alternatively, the initial value set by the filter initial setting unit may be a filter coefficient selected from among filter coefficients corresponding to a plurality of typical car models. Alternatively, the initial value set by the filter initial setting unit may be a filter coefficient which corresponds to the model of a car carrying the apparatus and which is obtained from outside of the apparatus. Accordingly, the initial value close to an ideal filter coefficient can be easily set.

Preferably, the speech correcting unit corrects the sound pressure level for each of a plurality of frequency bands. With this arrangement, speech correction suitable for each frequency band can be performed, and thus the clarity of output speech can be increased.

The speech correcting unit includes a gain table used for obtaining a corresponding correcting gain when specifying the sound pressure level of the ambient noise and a desired sound pressure level in audibility of the speech produced from the speaker for each of the plurality of frequency bands, and corrects the sound pressure level by referring to the gain table. Accordingly, a correction value of the sound pressure level for each frequency band can be easily calculated.

DESCRIPTION OF THE PREFERRED EMBODIMENTS

Hereinafter, a speech correction apparatus according to embodiments of the present invention will be described with reference to the drawings.

First Embodiment

Figure 1:
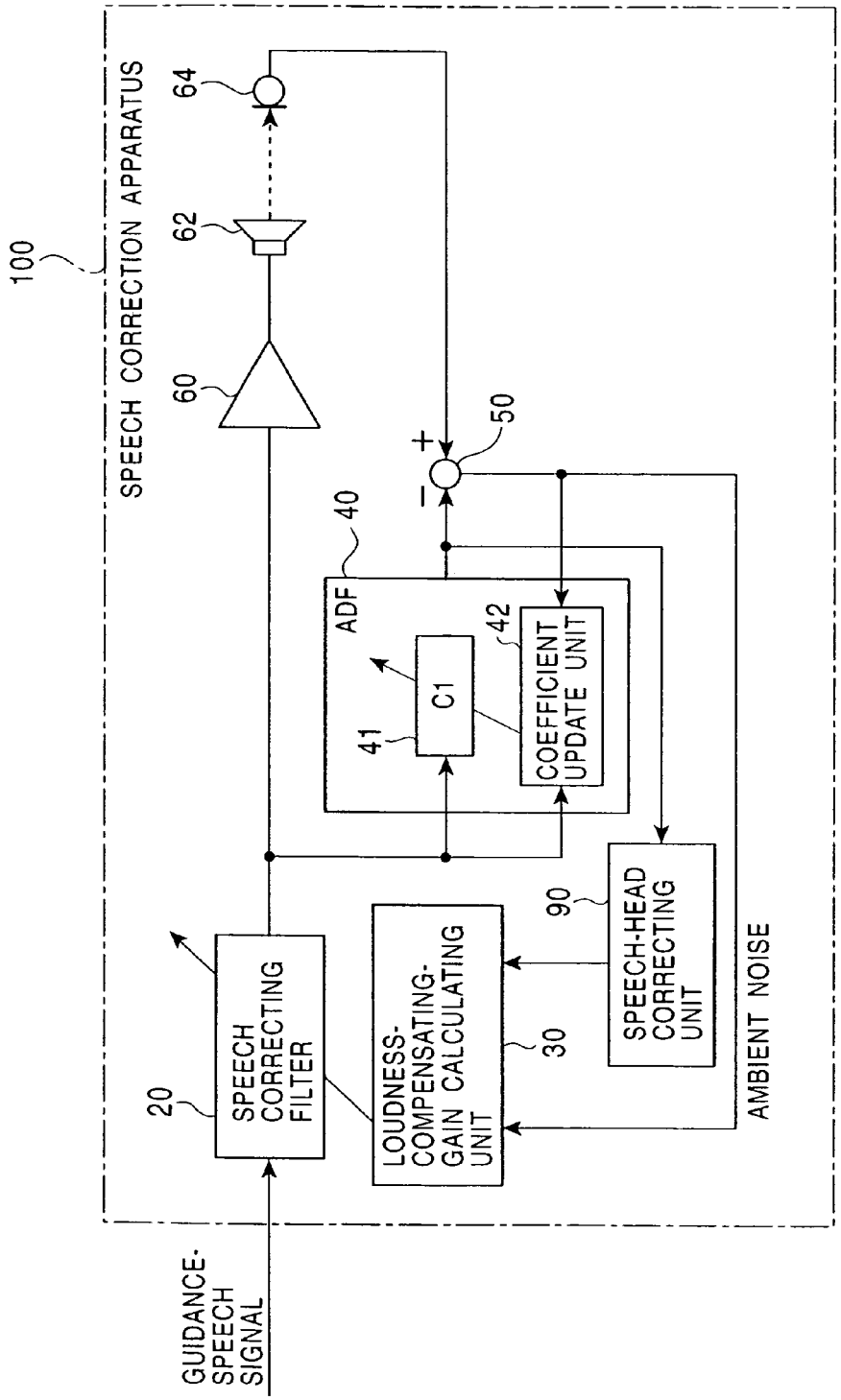
FIG. 1 shows the entire configuration of a speech correction apparatus according to a first embodiment.

FIG. 1 shows the entire configuration of a speech correction apparatus 100 of a first embodiment. As shown in FIG. 1, the speech correction apparatus 100 of this embodiment includes a speech correcting filter 20, a loudness-compensating-gain calculating unit 30, an adaptive filter (ADF) 40, an operating unit 50, an amplifier 60, a speaker 62, a microphone 64, and a speech-head correcting unit 90. The speech correction apparatus 100 is mounted in a car and receives a guidance-speech signal supplied from a navigation system (not shown). Then, the speech correction apparatus 100 corrects the gain of the input signal and generates a corrected guidance speech through the speaker 62.

The speech correcting filter 20 adjusts the gain of the input guidance-speech signal. The loudness-compensating-gain calculating unit 30 sets the gain for the speech correcting filter 20 so that the clarity of guidance speech which is to be generated through the speaker 62 and is to be heard by the user of the navigation system becomes substantially constant regardless of ambient noise. By using the speech correction apparatus 100 of this embodiment, the user can hear guidance speech with a constant clarity in terms of audibility at a hearing position.

An acoustic characteristic C1, which corresponds to the impulse response of the acoustic system from the identified speaker 62 to the microphone 64, is set in the adaptive filter 40. By passing a speech signal input to the speaker 62 through this adaptive filter 40, the impulse response of the speech generated from the speaker 62 so as to reach the microphone 64 can be reproduced.

The amplifier 60 amplifies the speech signal received from the speech correcting filter 20 and drives the speaker 62. The microphone 64 is set at a hearing position of guidance speech, for example, if the user is a driver of a car, near the head of the driver. The microphone 64 collects the guidance speech generated from the speaker 62 to the inside of the car and ambient noise.

The adaptive filter 40 includes an acoustic-characteristic setting unit 41 and a coefficient update unit 42. The adaptive filter 40 is used for identifying the acoustic characteristic C1 between the speaker 62 and the microphone 64. The filter coefficient of the acoustic-characteristic setting unit 41 is determined in the coefficient update unit 42 by using a least mean square (LMS) algorithm, for example.

The operating unit 50 subtracts the signal which has been passed through the adaptive filter 40 from the signal supplied from the microphone 64 and produces as an output the error thereof. The guidance-speech signal supplied from the speech correcting filter 20 is provided to the adaptive filter 40, and also passes through the amplifier 60, is generated as an output from the speaker 62, and then reaches the microphone 64. Therefore, by determining (updating) the filter coefficient C1 of the adaptive filter 40 by the coefficient update unit 42 so as to minimize the power of the error produced from the operating unit 50, the filter coefficient C1 can correspond with the impulse response of the acoustic system between the speaker 62 and the microphone 64.

The speech-head correcting unit 90 corrects the head portion of guidance speech by using a predetermined correction coefficient a so as to calculate the power of the guidance speech. By performing the correction, the calculated power does not become lower than the actual value.

The acoustic-characteristic setting unit 41 and the operating unit 50 correspond to a signal separating unit, the speech correcting filter 20 and the loudness-compensating-gain calculating unit 30 correspond to a speech correcting unit, the speech-head correcting unit 90 corresponds to a speech-head correcting unit, the operating unit 50 corresponds to an operating unit, and the adaptive filter 40 corresponds to an identifying unit and a coefficient update unit.

The speech correction apparatus of this embodiment has the above-described configuration. Next, the operation thereof will be described.

(1) Principle of Speech Correction

First, the principle of correcting the gain of guidance speech produced by the navigation system in this embodiment will be described.

Figure 2:
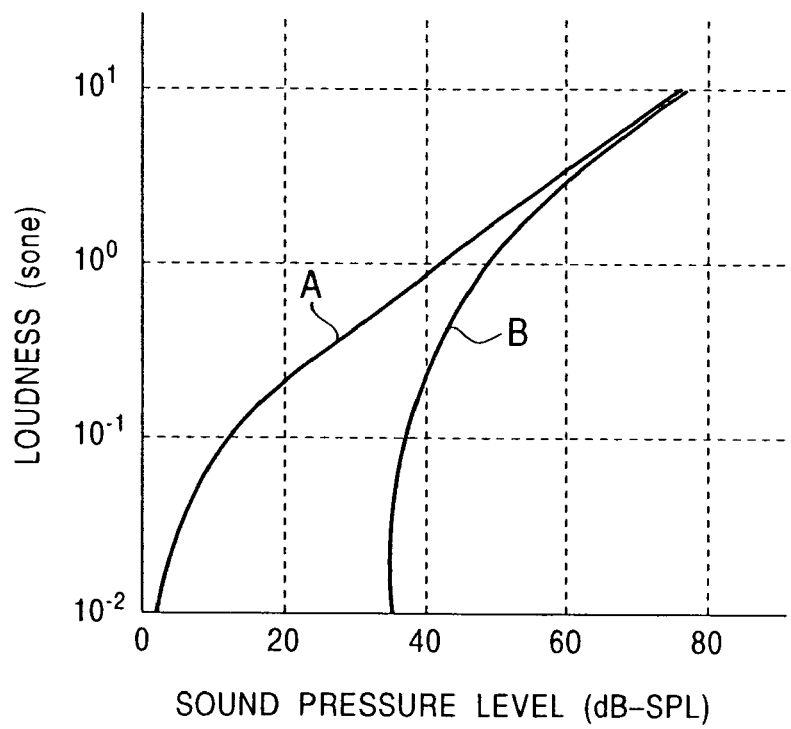
FIG. 2 shows the correspondence between a physical sound pressure level and loudness perceived by the human ear (loudness curve)

FIG. 2 shows a correspondence between a physical sound pressure level and loudness perceived by the human ear (loudness curve). In FIG. 2, the horizontal axis indicates a sound pressure level (unit: dB-SPL) and the vertical axis indicates loudness (unit: sone) perceived by the human ear. Curve A is a loudness curve under a silent environment and curve B is a loudness curve under a noisy environment. The curve B varies according to noise levels.

In FIG. 2, sounds of the same loudness are perceived as sounds of the same volume level by the human ear. For example, a sound perceived as that of 0.1 sone by the human ear corresponds to a sound of about 12 dB-SPL under the silent environment, whereas it corresponds to a sound of about 37 dB-SPL under the noisy environment of curve B. In other words, a sound of about 37 dB-SPL must be generated in order that the human ear may perceive a sound of 0.1 sone under the noisy environment of curve B, although the sound of 0.1 sone corresponds to about 12 dB-SPL under the silent environment. That is, a gain of about 25 dB needs to be added under the noisy environment of curve B. Likewise, a sound perceived as that of 1 sone by the human ear corresponds to a sound of about 42 dB-SPL under the silent environment and a sound of about 49 dB-SPL under the noisy environment of curve B. In this case, a gain of about 7 dB needs to be added under the noisy environment. Therefore, under the same noisy environment, a gain to be added must be changed in accordance with the sound pressure level of an output sound.

Figure 3:
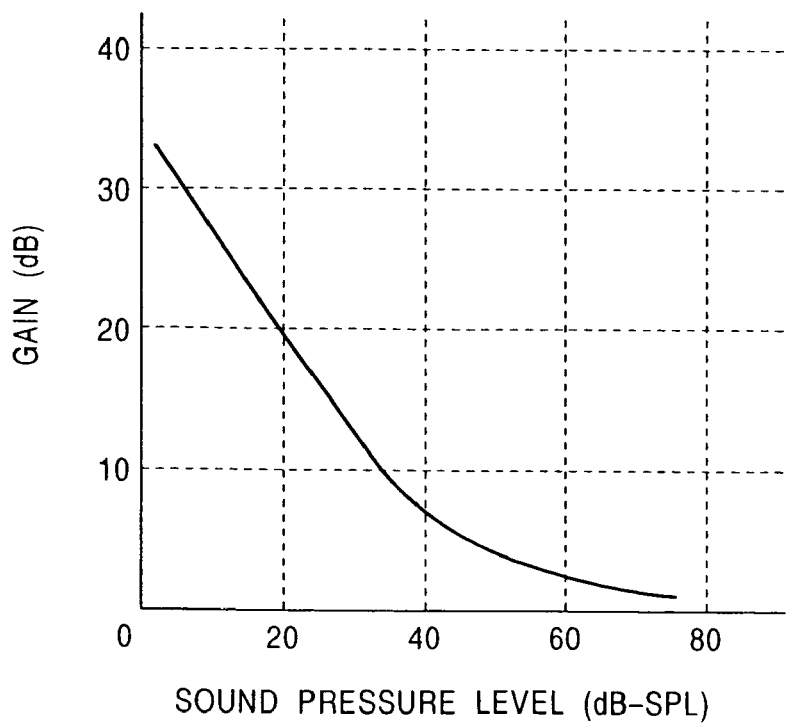
FIG. 3 shows the amount of gain which needs to be added to a sound pressure level under a silent environment so that the human ear can perceive the same loudness as in the silent environment under a noisy environment.

FIG. 3 shows the amount of gain which should be added to a sound pressure level under the silent environment so as to obtain the same loudness under the noisy environment as in the silent environment. In the Figure, the horizontal axis indicates the sound pressure level of a sound generated under the silent environment and the vertical axis indicates a gain which needs to be added so as to obtain the same loudness under the noisy environment as in the silent environment. For example, a sound generated at a sound pressure level of 20 dB under the silent environment needs to be added with a gain of about 19 dB in order to obtain the same loudness under the noisy environment as in the silent environment.

The loudness-compensating-gain calculating unit 30 includes a memory which stores the relationship between the sound pressure level of guidance speech and a gain to be added as shown in FIG. 3 at various noise levels (hereinafter referred to as gain tables). Also, the loudness-compensating-gain calculating unit 30 selects an optimal gain table based on a noise signal received from the operating unit 50 and calculates an optimal gain based on the selected gain table and a speech signal received from the acoustic-characteristic setting unit 41. The loudness-compensating-gain calculating unit 30 sets a filter coefficient of the speech correcting filter 20 so as to realize the calculated gain.

In general, guidance speech includes various frequency components and each frequency component may have a different sound pressure level. Therefore, difficulty in hearing guidance speech varies depending on the sound pressure level of each frequency component of a guidance-speech signal and a noise signal. Also, each frequency component of the noise signal has a masking effect on a higher frequency component of the guidance-speech signal, which must be taken into consideration.

Therefore, an optimal gain should be set for each frequency component of the guidance-speech signal. That is, desirably, each of the guidance-speech signal and the noise signal is divided into predetermined frequency bands. Then, an optimal gain table is selected for each frequency band based on the frequency component of the noise signal, and an optimal gain is calculated based on the selected gain table and the frequency component of the guidance-speech signal.

(2) Operation of the Speech Correction Apparatus

A guidance-speech signal supplied from the navigation system is provided to the amplifier 60 through the speech correcting filter 20 and is supplied to the speaker 62. The microphone 64 collects the guidance speech, audio sounds produced by an audio apparatus (not shown), and ambient noise including an engine sound, synthesizes these sounds, and provides a synthetic sound signal to the operating unit 50. The guidance-speech signal passed through the acoustic-characteristic setting unit 41, to which the acoustic characteristic C1 between the speaker 62 and the microphone 64 is set, has been provided to the operating unit 50, as well as the sound signal from the microphone 64. The operating unit 50 extracts an ambient-noise signal corresponding to a difference between these signals, and the ambient-noise signal is supplied to the loudness-compensating-gain calculating unit 30. Also, the guidance-speech signal supplied from the acoustic-characteristic setting unit 41 is provided to the loudness-compensating-gain calculating unit 30 through the speech-head correcting unit 90.

The loudness-compensating-gain calculating unit 30 sets the gain for the speech correcting filter 20 based on the sound pressure level of the ambient-noise signal received from the operating unit 50 so that the sound pressure level of the guidance-speech signal at the hearing position (position to which the microphone 64 is set) supplied from the acoustic-characteristic setting unit 41 is set at a predetermined value.

(3) Operation of the Speech-Head Correcting Unit

Next, an operation of correcting the sound pressure level of the head portion of guidance speech, which is performed by the speech-head correcting unit 90, will be described.

Figure 4:
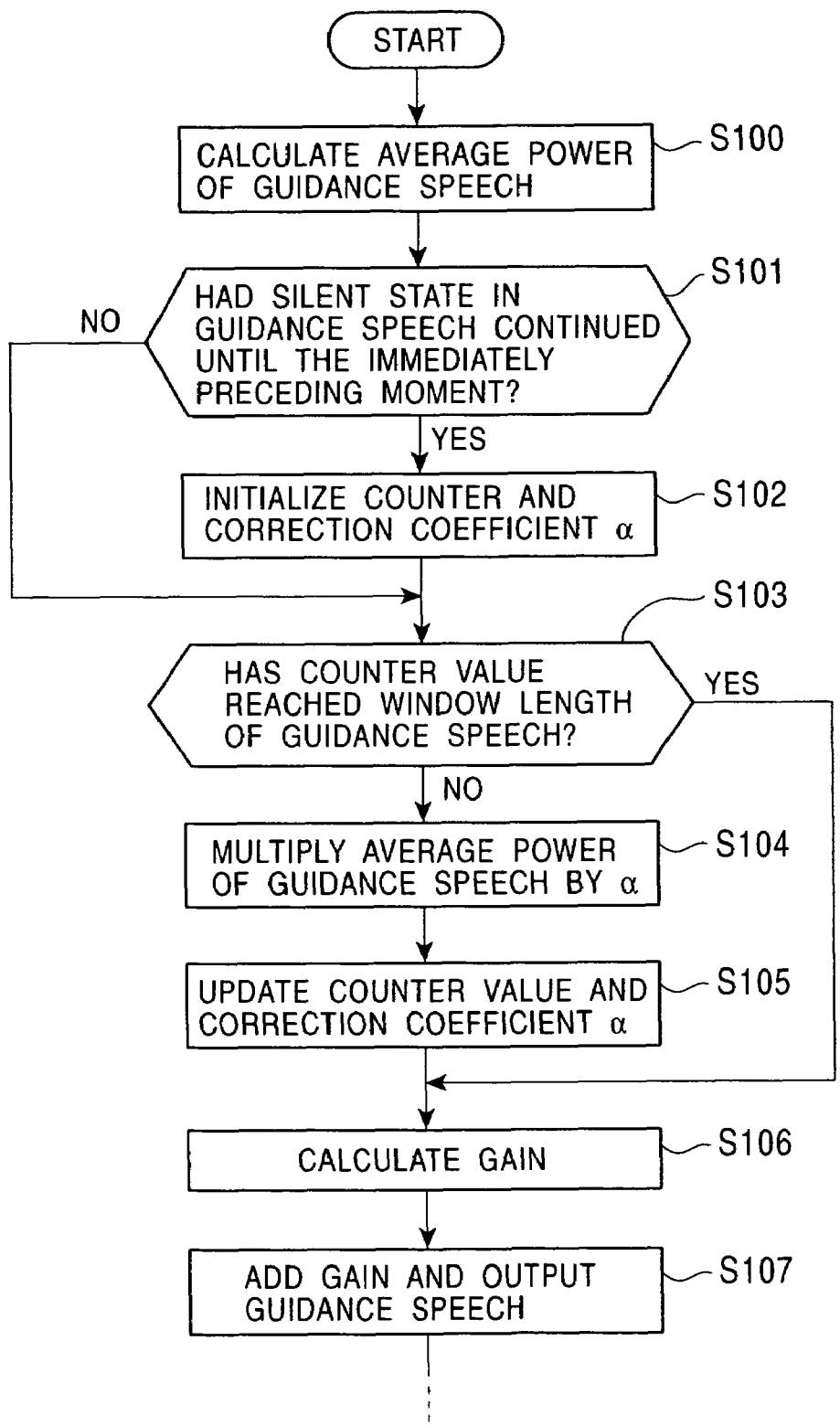
FIG. 4 is a flowchart showing a process of correcting the average power of the head portion of guidance speech, performed by a speech-head correcting unit.

FIG. 4 is a flowchart showing a process of correcting a calculated average power of the head portion of guidance speech, the process being performed by the speech-head correcting unit 90. First, the speech-head correcting unit 90 calculates the average power of the guidance speech (step S100). The calculation is performed for each guidance-speech signal received from the acoustic-characteristic setting unit 40 at predetermined sampling intervals. Alternatively, the calculation may be performed at longer time intervals than the sampling intervals in order to reduce the calculation amount. Also, the average power is calculated by using a predetermined window length (time length) Ls. That is, by calculating the average power of the guidance-speech signal obtained during the time period corresponding to the predetermined window length Ls, the average power of the guidance speech is calculated.

Then, the speech-head correcting unit 90 determines whether or not a silent state in the guidance speech had continued until the immediately preceding moment based on the average power of the immediately preceding guidance speech (step S101). If the silent state had continued until the immediately preceding moment, a positive determination is made and a counter and a correction coefficient α are initialized (step S102). Herein, the counter is used for counting an elapsed time corresponding to the window length Ls for calculating the average power of the guidance speech after detecting the head portion of the guidance speech (after shifting from a silent portion to a speech portion). In step S102, the counter is initialized, that is, set at 0. The correction coefficient α is used for correcting the average power of the guidance speech so that the average power does not become lower than the actual value, and is changed according to the counter value.

After initialization of the counter and the correction coefficient α, or when the average power of the immediately preceding guidance speech is not 0 and thus a negative determination is made in step S101, the speech-head correcting unit 90 determines whether or not the counter value has reached the value corresponding to the window length Ls of the guidance speech (step S103). If the counter value has not reached the window length Ls, a negative determination is made and the average power of the guidance speech is multiplied by α (step S104), and then the counter value and the correction coefficient α are updated (step S105).

For example, the counter value is k and the window length (time length) used for calculating the average power of noise is Ln. In this case, the correction coefficient α and the counter value k are updated by using the following equation.

$$\alpha = Ls/Ln \qquad (k \leq Ln)$$
$$= -k/Ln + (Ln + Ls)/Ln \quad (Ln < k \leq Ls)$$
$$= 1 \qquad (Ls < k)$$
$$k = k + 1$$

Then, after the calculated average power of the guidance speech has been corrected by using the correction coefficient α, the gain for the speech correcting filter 20 is calculated by the loudness-compensating-gain calculating unit 30 by using this corrected value (step S106). The gain calculated in this way is added to the guidance speech, and the corrected guidance speech is provided as an output (step S107).

If the counter value has reached the value corresponding to the window length Ls of the guidance speech, a positive determination is made in step S103. In this case, the average power of the guidance speech is not corrected and the process skips to step S106, where the loudness-compensating-gain calculating unit 30 calculates a gain.

In this way, when only the head portion of the guidance speech is included in the window length Ls for calculating the average power, correction is performed by multiplying the average power calculated by using only the head portion by the correction coefficient α. Therefore, a calculated average power of the guidance speech does not become much lower than the actual value, so that an excessive correction of the head portion of the guidance speech can be prevented.

Figure 5:
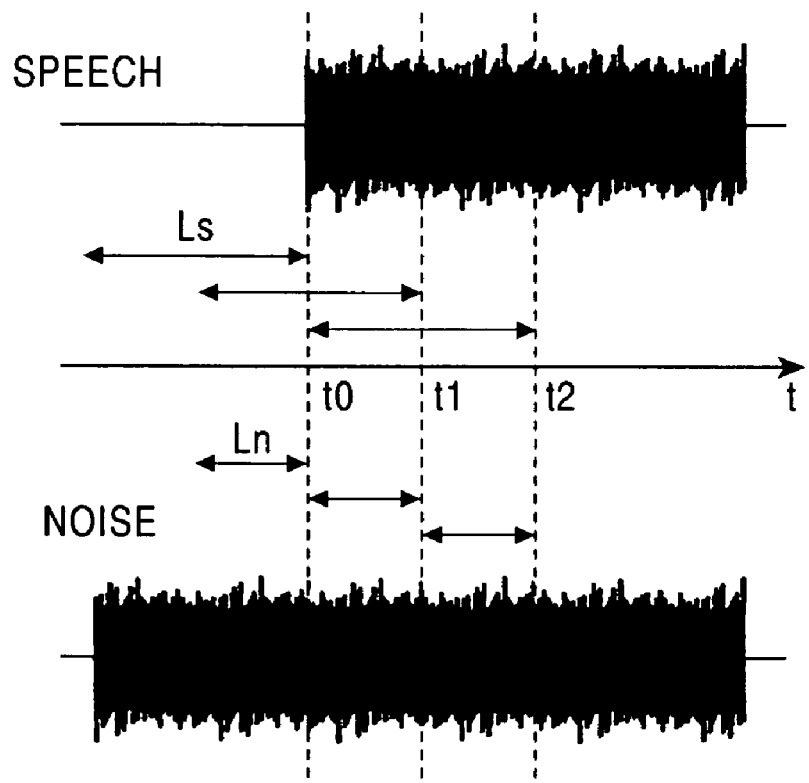
FIG. 5 illustrates the head portion of the guidance speech.

FIG. 5 illustrates a correction of the head portion of the guidance speech. In FIG. 5, the horizontal axis is a time base.

The guidance speech begins from time t0, but ambient noise of a predetermined sound pressure level (average power) is generated before then.

A silent state continues in the guidance speech until time t0. Therefore, a positive determination is made in step S101 and the counter value and the correction coefficient α are initialized and set at 0.

After reaching time t0 until the time period corresponding to the window length Ln for calculating the average power of ambient noise has elapsed (until time t1), the correction coefficient α is set at Ls/Ln. For example, in the example shown in FIG. 5, Ls/Ln=2, and thus the correction coefficient α is set at 2. Therefore, the average power of the guidance speech during this period is doubled so as to correct the average power, and the corrected average power is transmitted to the loudness-compensating-gain calculating unit 30.

After reaching time t1 until the time period corresponding to the window length Ls for calculating the average power of the guidance speech has elapsed from time t0 (until time t2), the correction coefficient α is set at a value calculated with (−k/Ln+(Ln+Ls)/Ln), that is, at a value linearly changing from −2 to −1 from time t1 toward time t2 by linear interpolation.

After reaching time t2, the correction coefficient α is set at 1. Therefore, the guidance-speech signal which is not corrected by the correction coefficient α is supplied to the loudness-compensating-gain calculating unit 30.

Figure 6:
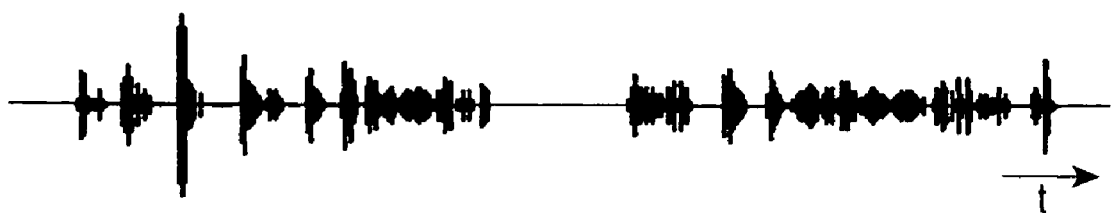
FIG. 6 shows the guidance speech which has been corrected by the speech correction apparatus of the first embodiment.
Figure 15A:
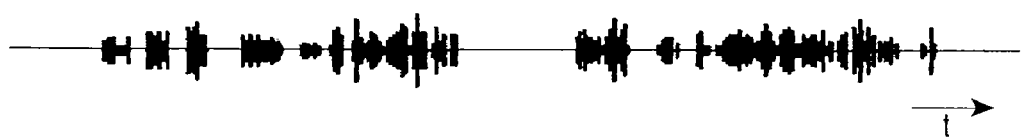
FIGS. 15A and 15B show an example of excessive correction of the head portion of speech.

FIG. 6 shows the guidance speech which has been corrected by using the speech correction apparatus 100 of this embodiment, the Figure showing a result obtained by correcting the guidance speech having the waveform shown in FIG. 15A.

Figure 15B:
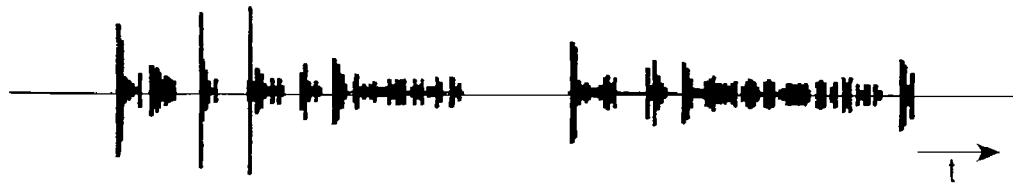

As can be seen by comparing the waveform shown in FIG. 6 with the guidance speech before correction shown in FIG. 15A and the guidance speech which has been corrected by the known method shown in FIG. 15B, an excessive correction at the head portion of the guidance speech is significantly improved by using the speech correction apparatus 100 of this embodiment.

(4) Other Configurations

Next, a general configuration of the loudness-compensating-gain calculating unit 30 and the speech correcting filter 20 will be described.

(4-1) Specific Configuration of the Loudness-Compensating-Gain Calculating Unit 30

Figure 7:
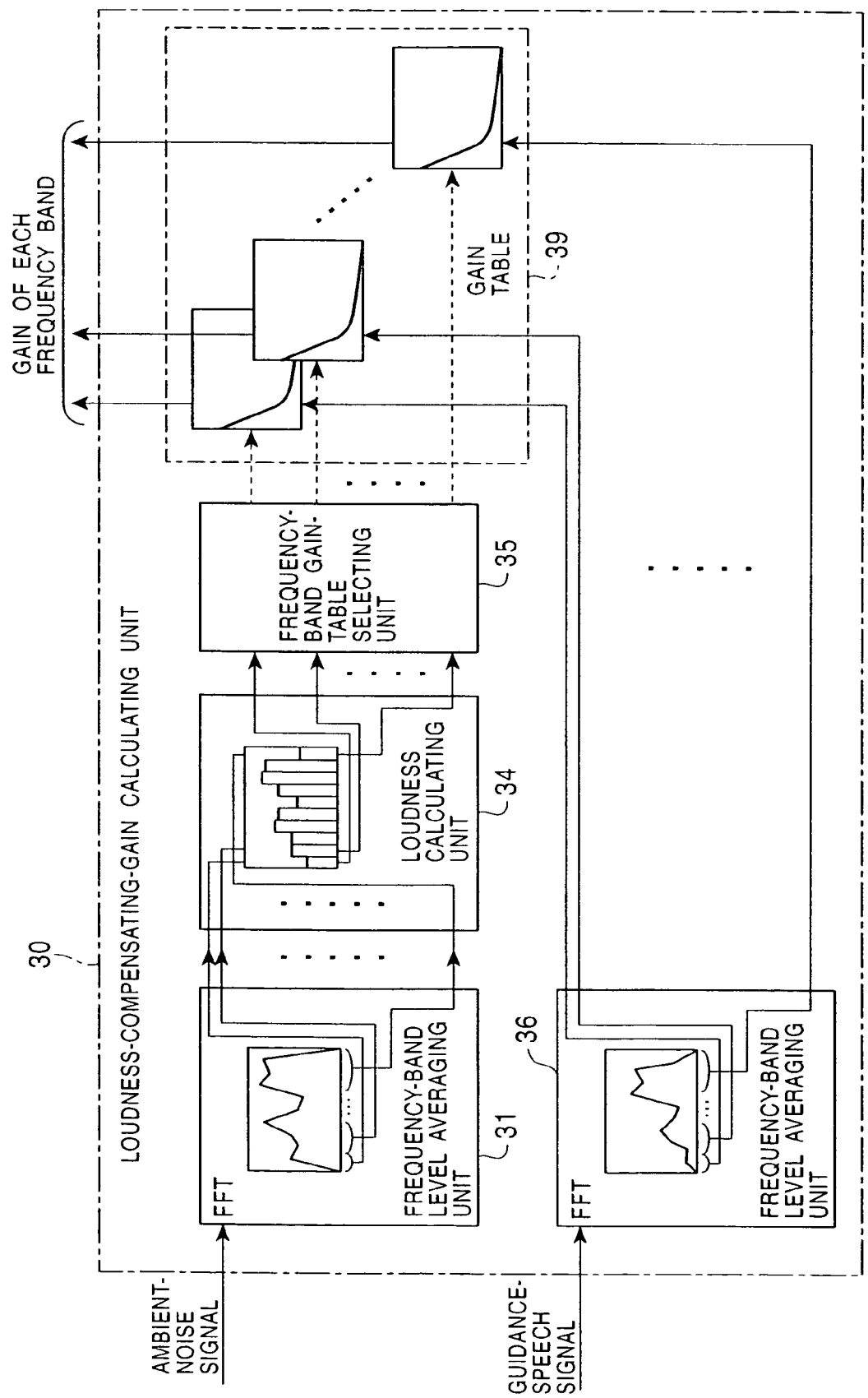
FIG. 7 shows the configuration of a loudness-compensating-gain calculating unit.

FIG. 7 shows the configuration of the loudness-compensating-gain calculating unit 30. As shown in FIG. 7, the loudness-compensating-gain calculating unit 30 includes a frequency-band level averaging unit 31, a loudness calculating unit 34, a frequency-band gain-table selecting unit 35, a frequency-band level averaging unit 36, and a gain table 39.

The frequency-band level averaging unit 31 performs a fast Fourier transform (FFT) operation to the ambient-noise signal provided from the operating unit 50 in each predetermined time block so as to calculate the average sound pressure level of each predetermined frequency band. Since the auditory sense of a human being can recognize a difference in loudness of substantially every ⅓ octave, the ambient noise is divided into frequency bands in the unit of ⅓ octave.

The loudness calculating unit 34 adjusts the sound pressure level of each frequency band of the ambient-noise signal which is generated by the frequency-band level averaging unit 31, by using a known Zwicker's loudness calculating method (ISO 532B) or Stevens' loudness calculating method (ISO 532A). More specifically, adjustment is performed in the following way. When ambient noise of some frequency component exists, this ambient noise affects the difficulty in hearing a guidance-speech signal of the same frequency component. In addition, as described above, the ambient noise affects the difficulty in hearing a guidance-speech signal of a frequency component adjacent to the high-frequency side. The loudness calculating unit 34 considers this condition, and adjusts the sound pressure level of each frequency component of the ambient noise according to the sound pressure level of the frequency component of the ambient noise adjacent to the low-frequency side. When the sound pressure level of the adjacent low-frequency component is high, the sound pressure level of the frequency component adjacent to the high-frequency side is corrected to a higher level. By performing such an adjustment, a gain table for each frequency band can be adequately selected by paying attention to only the sound pressure level of each corresponding frequency band of the ambient noise, and thus a complicated process of considering ambient noise of the frequency band adjacent to the low-frequency side need not be performed.

The frequency-band gain-table selecting unit 35 selects an optimal gain table 39 for each frequency band based on the adjusted sound pressure level of each frequency band of the ambient noise received from the loudness calculating unit 34.

The frequency-band level averaging unit 36 performs the known FFT operation on the guidance-speech signal received from the acoustic-characteristic setting unit 41 in each short-time block, so as to calculate the average sound pressure level for each predetermined frequency band. The guidance-speech signal is divided into frequency bands in the same manner as the ambient noise. Each frequency band of the guidance-speech signal generated by the frequency-band level averaging unit 36 is supplied to the gain table 39 selected by the frequency-band gain-table selecting unit 35, so that an appropriate gain is calculated for each frequency band.

In this way, by dividing the ambient-noise signal and the guidance-speech signal into predetermined frequency bands, a gain table can be selected for each frequency band and an optimal gain can be added to the guidance-speech signal.

In the above-described loudness-compensating-gain calculating unit 30, the average sound pressure level in each frequency band of the guidance-speech signal and the ambient-noise signal is calculated by using the frequency-band level averaging units 31 and 36. Alternatively, the average sound pressure level in each frequency band may be calculated by using a filter bank and a block averaging unit instead of these frequency-band level averaging units.

Figure 8:
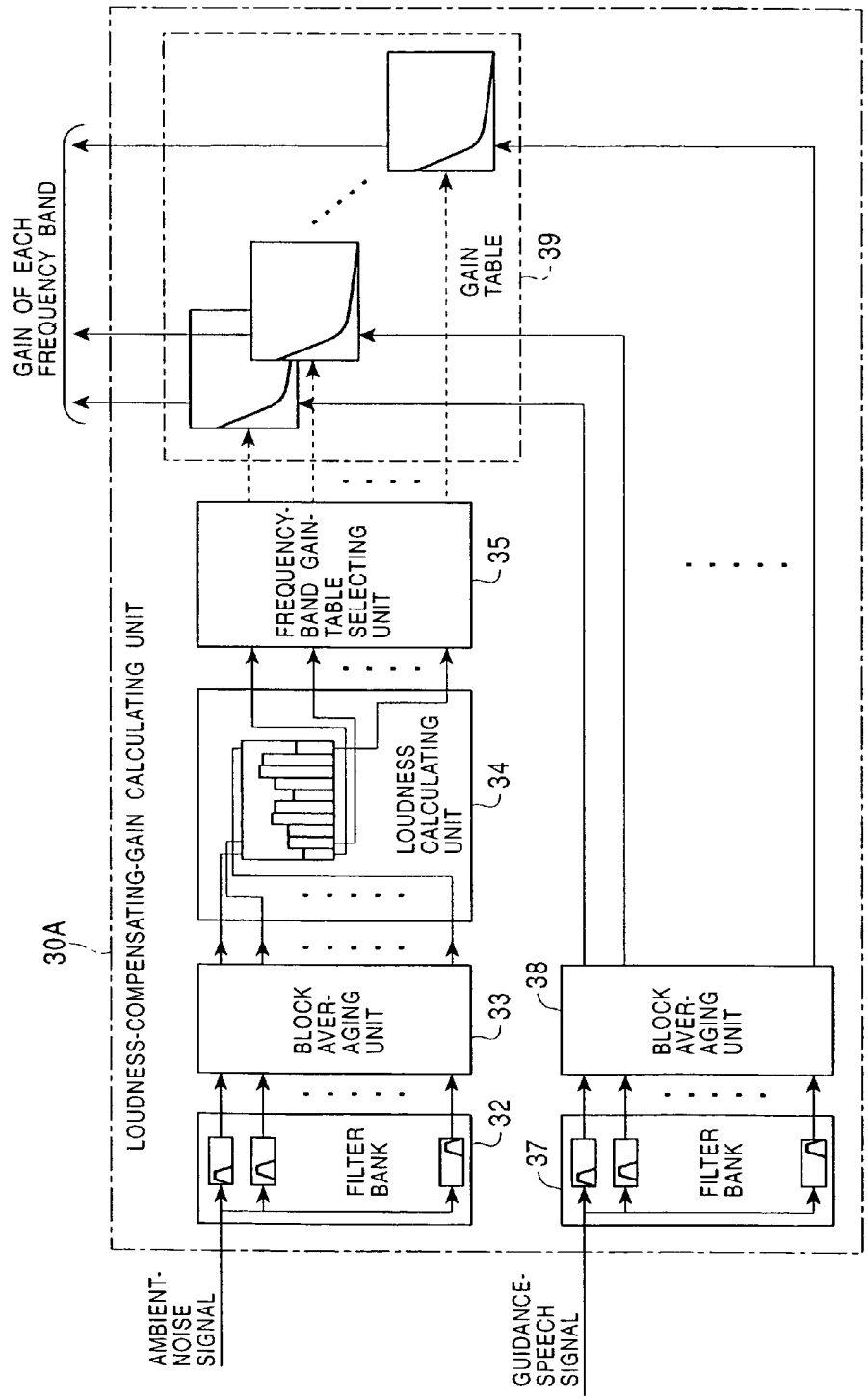
FIG. 8 shows the configuration of a loudness-compensating-gain calculating unit according to a modification.

FIG. 8 shows the configuration of a loudness-compensating-gain calculating unit 30A according to a modification. The loudness-compensating-gain calculating unit 30A shown in FIG. 8 includes a filter bank 32, a block averaging unit 33, the loudness calculating unit 34, the frequency-band gain-table selecting unit 35, a filter bank 37, a block averaging unit 38, and the gain table 39.

The filter bank 32 is a group of band-pass filters having a predetermined frequency bandwidth. By using these band-pass filters, the ambient-noise signal received from the operating unit 50 is divided into predetermined frequency bands. The block averaging unit 33 calculates the average sound pressure level of the ambient-noise signal divided into frequency bands received from the filter bank 32 in each predetermined time block, and provides the calculation result to the loudness calculating unit 34.

The filter bank 37 is a group of band-pass filters having a predetermined frequency bandwidth, as in the filter bank 32. By using these band-pass filters, the guidance-speech signal received from the acoustic-characteristic setting unit 41 is divided into predetermined frequency bands. The block averaging unit 38 calculates the average sound pressure level of the guidance-speech signal divided into frequency bands received from the filter bank 37 in each predetermined time block, and provides the average sound pressure level to the gain table 39.

In this way, by using the filter banks and the block averaging units, the ambient-noise signal and the guidance-speech signal can be divided into predetermined frequency bands. Also, a gain table can be selected for each frequency band and an optimal gain can be added to the guidance-speech signal.

(4-2) Specific Configuration of the Speech Correcting Filter

The speech correcting filter 20 may take various configurations as long as it can modify the gain characteristic (add gain) calculated by the above-described loudness-compensating-gain calculating unit 30.

Figure 9:
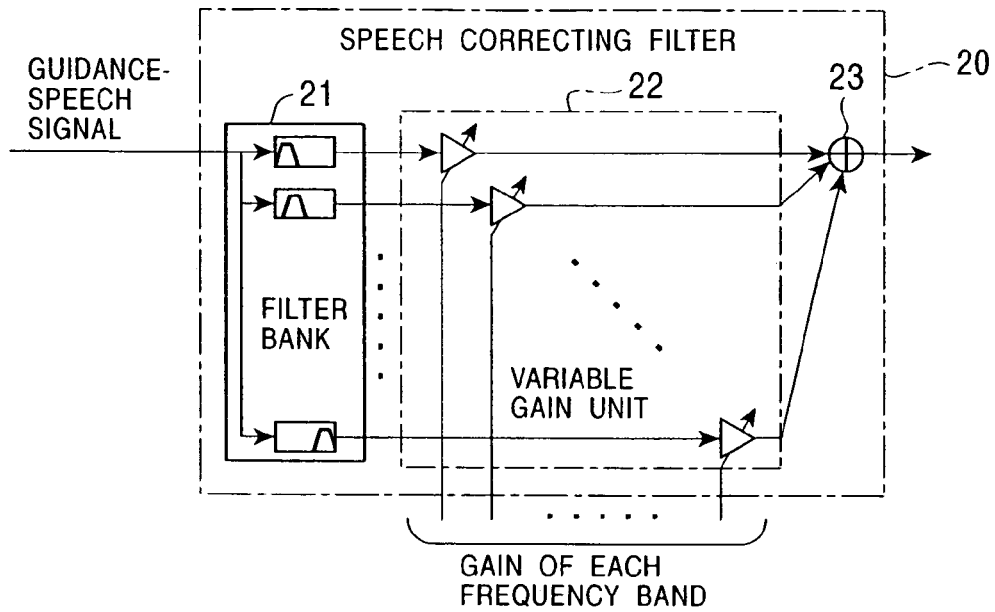
FIG. 9 shows a specific configuration of a speech correcting filter including a filter bank and a variable gain unit.

FIG. 9 shows a specific configuration of the speech correcting filter 20 including a filter bank and a variable gain unit. The speech correcting filter 20 shown in FIG. 9 includes a filter bank 21, a variable gain unit 22, and an adder 23.

The filter bank 21 is a group of band-pass filters having a predetermined frequency bandwidth. By using these band-pass filters, the guidance-speech signal is divided into frequency bands. The variable gain unit 22 applies the gain of each frequency band calculated by the loudness-compensating-gain calculating unit 30 to the sound pressure level of each frequency band of the guidance-speech signal received from the filter bank 21, so as to perform gain adjustment. The adder 23 adds the frequency bands, each having been gain-adjusted, and generates the guidance-speech signal so as to realize a desired gain correction. With this configuration, the speech correcting filter 20 can be formed by using an analog circuit with a low cost.

Figure 10:
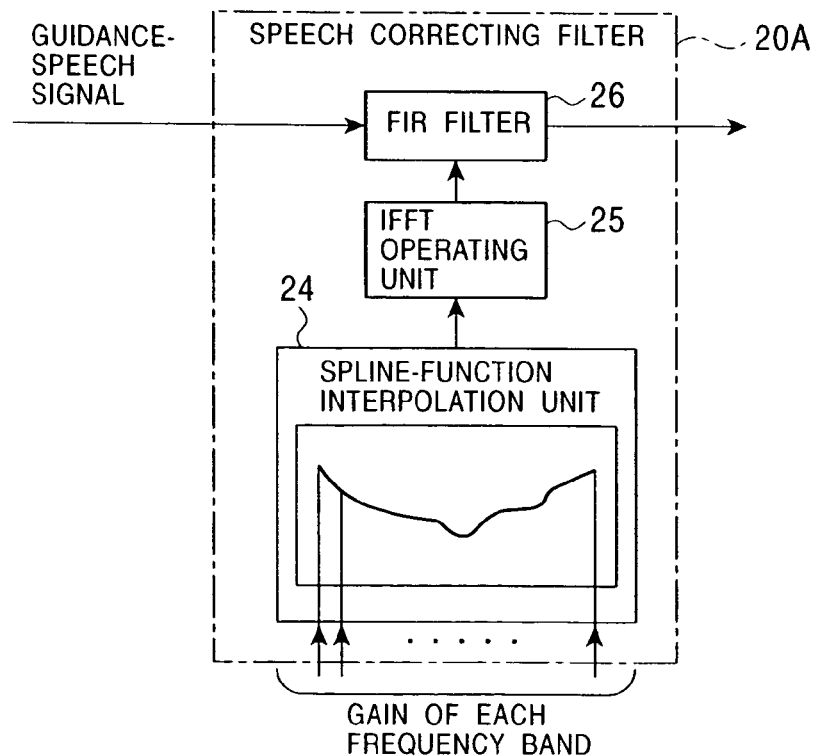
FIG. 10 shows the configuration of another speech correcting filter including a frequency sampling filter.

FIG. 10 shows the configuration of a speech correcting filter 20A using a frequency sampling filter. The speech correcting filter 20A shown in FIG. 10 includes a spline-function interpolation unit 24, an IFFT operating unit 25, and an FIR filter 26.

The spline-function interpolation unit 24 regards the gain of each frequency band calculated by the loudness-compensating-gain calculating unit 30 as the gain of the center frequency of each frequency band and interpolates between the gains by using a known spline function, so as to obtain a smooth gain characteristic in the frequency domain. The IFFT operating unit 25 converts the gain characteristic supplied by the spline-function interpolation unit 24 from the frequency domain to the time domain by using a known inverse fast Fourier transform (IFFT) operation and sets a tap coefficient of the FIR filter 26. The FIR filter 26 performs a filtering process on the time base to the guidance-speech signal so as to realize a desired gain correction. With this configuration, a linear phase filter can be realized. Also, correction of the guidance-speech signal can be performed for each frequency component, not for each frequency band.

Figure 11:
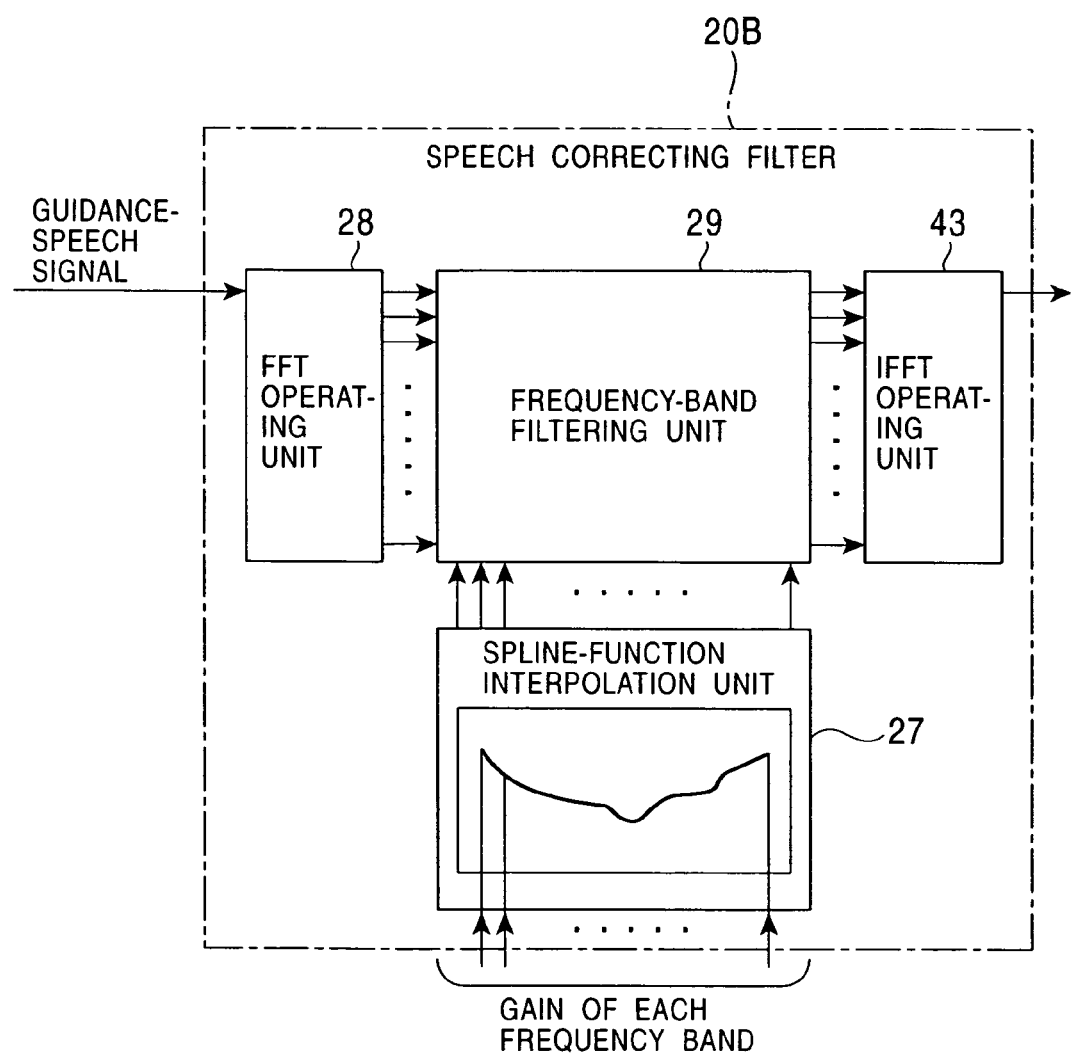
FIG. 11 shows the configuration of another speech correcting filter including a frequency-region filter.

FIG. 11 shows the configuration of a speech correcting filter 20B using a frequency-region filter. The speech correcting filter 20B shown in FIG. 11 includes a spline-function interpolation unit 27, an FFT operating unit 28, a frequency-band filtering unit 29, and an IFFT operating unit 43.

The spline-function interpolation unit 27 regards the gain of each frequency band calculated by the loudness-compensating-gain calculating unit 30 as the gain of the center frequency of each frequency band and interpolates between the gains by using a known spline function, so as to obtain a smooth gain characteristic in the frequency domain. The FFT operating unit 28 performs an FFT operation to the guidance-speech signal so as to convert the time domain to the frequency domain. The frequency-band filtering unit 29 filters the guidance-speech signal in the frequency domain received from the FFT operating unit 28 by using the smooth gain characteristic supplied by the spline-function interpolation unit 27. The IFFT operating unit 43 performs an IFFT operation to the guidance-speech signal in the frequency domain received from the frequency-band filtering unit 29 so as to convert the frequency domain to the time domain, to realize a desired gain correction. In the IFFT operation, a known overlap-add method or overlap-save method may be used in order to realize linear filtering. With this configuration, the amount of operations can be reduced even if the number of taps of the filter is large.

In any of the above-described three speech correcting filters 20, 20A, and 20B, the output waveform becomes discontinuous if the gain abruptly changes. Therefore, preferably, the gain characteristic is gradually updated by using a relational expression: $G(n)=\alpha G(n-1)+\beta Gm$. Herein, $G(n)$ is a gain characteristic at time n, $G(n-1)$ is a gain characteristic at time n−1, and Gm is a gain characteristic calculated by the loudness-compensating-gain calculating unit 30 or the spline-function interpolation unit 24 or 27. $\alpha$ and $\beta$ are coefficients and have the relationship of $\alpha+\beta=1$.

As described above, by using the speech correction apparatus 100 of this embodiment and by adjusting the average power calculated corresponding to the head portion of the guidance speech to be corrected, an excessive correction of the head portion of the guidance speech, which would be caused if the average power is not adjusted, can be prevented.

In particular, an excessive correction of the head portion of the guidance speech is significant when the window length (time length) Ls for calculating the average power of the guidance speech is longer than the window length (time length) Ln for calculating the average power of the ambient noise. In this embodiment, however, an excessive correction of the head portion of the guidance speech can be effectively prevented even in such a case.

The speech-head correcting unit 90 multiplies the average power of the guidance speech by Ls/Ln for the time length Ln just after shifting from a silent state to a speech state at the speech head. Accordingly, an error caused by the difference between periods for calculating the average power of the guidance speech and ambient noise can be corrected.

Also, the speech-head correcting unit 90 sequentially reduces the correction amount of the average power of the guidance speech after the time Ln has passed until the time Ls passes, with the border between the silent state and the speech state at the speech head being the reference. Accordingly, an unnatural transition in the guidance speech at the border between a portion in which the average power is corrected and a portion in which the average power is not corrected can be prevented.

The present invention is not limited to the above-described embodiment, and various modifications can be realized within the scope of the present invention. In the above-described embodiment, the correction coefficient $\alpha$ is set at 1 or a larger value during the time period from the head portion of the guidance speech until the time corresponding to the window length Ls for calculating the average power of the guidance speech has elapsed, so that the calculated average power of the guidance speech is simply corrected to a larger value. Alternatively, during this period (or a shorter period), a process of correcting the sound pressure level by using the loudness compensating technique may be totally stopped so that addition of gain is not performed.

Figure 12:
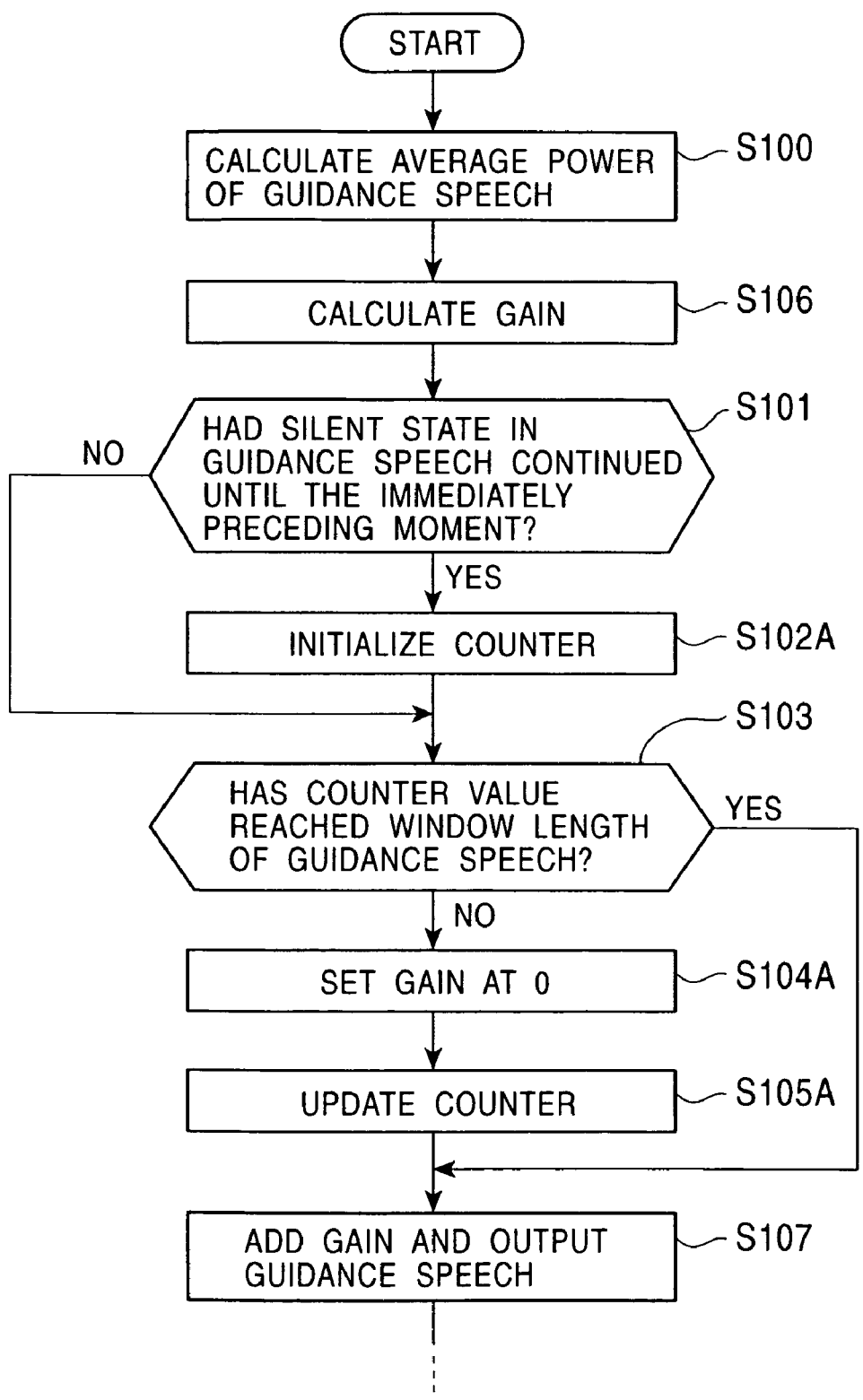
FIG. 12 is a flowchart showing a process performed by the speech-head correcting unit in which gain is not added to the head portion of the guidance speech.

FIG. 12 is a flowchart showing a process performed by the speech-head correcting unit 90, in which a gain is not added to the head portion of the guidance speech. The difference between the flowchart shown in FIG. 12 and that shown in FIG. 4 is that the position of step S106 is changed and that steps S102, S104, and S105 are replaced by steps S102A, S104A, and S105A, respectively.

After a gain is calculated in the known manner (step S106), the speech-head correcting unit 90 initializes the counter if a silent state in the guidance speech had continued until the immediately preceding moment (step S102A). If the counter value k has not reached the time corresponding to the window length Ls of the guidance speech, a negative determination is performed in step S103. Then, the speech-head correcting unit 90 sets the gain determined by the loudness-compensating-gain calculating unit 30 at 0 dB (step S104A) and updates the counter value k (step S105A). In this way, the gain of the guidance speech is not corrected while the gain is set at 0, and thus an excessive correction of the head portion of the guidance speech can be prevented.

Also, in the above-described embodiment, the correction coefficient α is set in two steps during the time period after reaching the head portion of the guidance speech until the time corresponding to the window length Ls for average power calculation of the guidance speech has elapsed. Alternatively, a fixed value of 1 or more, for example, 1.5 or 2, may be used as the correction coefficient α across the board. Accordingly, an excessive correction of the head portion of the guidance speech can be prevented, and a procedure of setting the correction coefficient α can be simplified.

In the above-described embodiment, the gain of guidance speech generated by a car-mounted navigation system is corrected. However, the present invention can be applied for correcting the gain of other types of sound produced inside a car or the gain of sound of a broadcast program produced from a television set in a room.

In the above-described embodiment and second and third embodiments described below, guidance speech is used as a sound to be corrected. However, the sound to be corrected in this specification includes not only human speech but also sounds (for example, audio sounds) included in a frequency band within the same or wider audibility range. Therefore, by receiving an audio sound, instead of guidance speech, as the sound to be corrected by the speech correction apparatus 100, the audio sound can be clearly heard regardless of an ambient noise level.

Second Embodiment

The acoustic-characteristic setting unit 41 in the adaptive filter 40 includes an FIR filter, and each filter coefficient (tap coefficient) of this FIR filter is set at 0 in the initial state just after power-on. Then, after a first guidance-speech signal has been received, each filter coefficient is sequentially updated from 0 to another value. Therefore, during a time period from the initial state until each filter coefficient is updated to some value, the estimated sound pressure level of the guidance speech at the microphone position supplied from the adaptive filter 40 gradually increases toward the actual sound pressure level of the guidance speech. As a result, the head portion of the guidance speech provided to the adaptive filter 40 in the initial state is excessively corrected. The speech correction apparatus of the second embodiment prevents an excessive correction of the head portion of the guidance speech caused by this reason.

Figure 13:
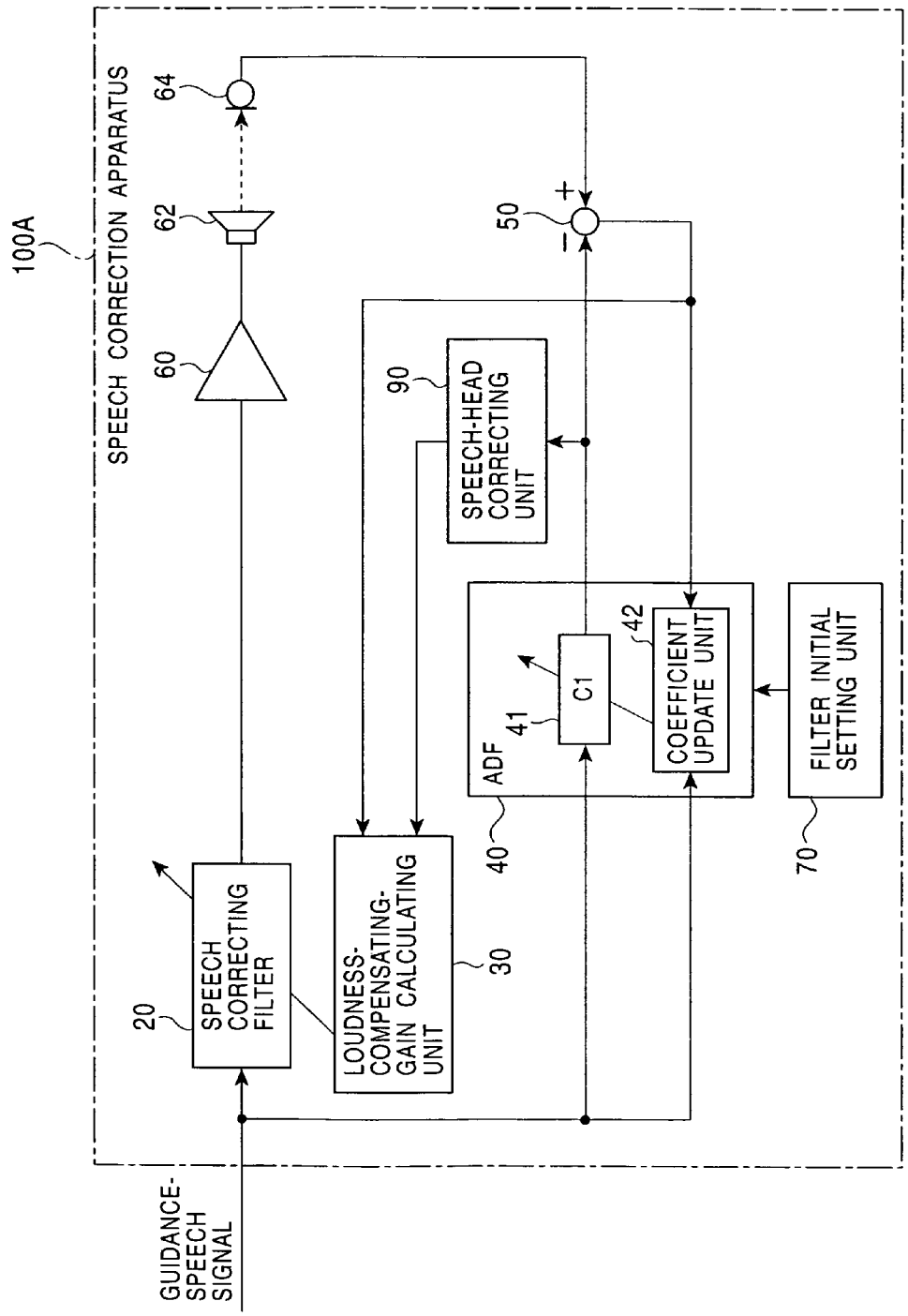
FIG. 13 shows the entire configuration of a speech correction apparatus according to a second embodiment.

FIG. 13 shows the entire configuration of a speech correction apparatus 100A of the second embodiment. As shown in FIG. 13, the speech correction apparatus 100A of this embodiment includes the speech correcting filter 20, the loudness-compensating-gain calculating unit 30, the adaptive filter 40, the operating unit 50, the amplifier 60, the speaker 62, the microphone 64, a filter initial setting unit 70, and the speech-head correcting unit 90.

The speech correction apparatus 100A is different from the speech correction apparatus 100 shown in FIG. 1 in that the filter initial setting unit 70 is provided and that a guidance-speech signal is directly supplied to the adaptive filter 40 without going through the speech correcting filter 20. However, an operation of estimating the guidance speech at the microphone position by the adaptive filter 40 is substantially the same as in the first embodiment, although the filter coefficient of the acoustic-characteristic setting unit 41 updated by the coefficient update unit 42 is changed to a value set by considering the filter characteristic of the speech correcting filter 20 by changing the connection of the adaptive filter 40.

The filter initial setting unit 70 sets each filter coefficient of the FIR filter forming the acoustic-characteristic setting unit 41 in the adaptive filter 40 to an initial value other than 0 just after power-on (or just after a reset operation is performed in a reset circuit (not shown) for initializing each filter coefficient of the acoustic-characteristic setting unit 41 in the adaptive filter 40). The filter initial setting unit 70 corresponds to a filter initial setting unit.

If the acoustic characteristic C1 corresponding to the impulse response of the acoustic system between the speaker 62 and the microphone 64 is known, this value should be set as the initial value of each filter coefficient. However, the acoustic characteristic C1 is not constant and varies in accordance with the shape of a car in which the speech correction apparatus 100A is mounted, the setting position of the speaker 62, and the material and shape of mounted objects such as a seat. Therefore, in the filter initial setting unit 70 of this embodiment, any of the following values (1) to (3) can be adopted as the initial value just after power-on.

(1) A filter coefficient corresponding to a representative car model, which is determined based on the statistical number of cars for sale, can be used as the initial value. The representative car model may be a top-selling car model in the latest statistics or may be several top-selling car models. When a plurality of car models are applied, a filter coefficient is measured in advance for each model and these coefficients are averaged, so that the average value is used as the initial value. Accordingly, the possibility of setting an initial value close to an ideal filter coefficient can be increased.

(2) A filter coefficient selected from among filter coefficients corresponding to typical car models can be used as the initial value. For example, filter coefficients measured in advance for the car models are stored inside or outside the filter initial setting unit 70. When the model of the car in which the speech correction apparatus 100A is mounted is specified, the filter initial setting unit 70 reads the filter coefficient of the specified model, which is used as the initial value. Various methods may be used for specifying the car model. For example, when another device such as an engine controller contains car-model information, the car-model information is obtained so as to specify the car model. When a DIP switch (or a switch having an equivalent function) for setting a car model is provided, the user operates the DIP switch so as to specify the car model, such as sedan or minivan. Alternatively, instead of such a mechanical operation, a predetermined car-model setting screen is created by the filter initial setting unit 70 (or another control unit) so as to display the screen on a display, and the user may specify the car model by operating the operating unit while viewing the screen.

(3) A filter coefficient which corresponds to the model of the car carrying the speech correction apparatus 100A and which is obtained from outside of the apparatus can be used as the initial value. When a typical filter coefficient suitable for the model of the car in which the speech correction apparatus 100A is mounted can be obtained from outside of the speech correction apparatus 100A, that filter coefficient is used. For example, a filter coefficient stored in a removable recording medium, such as a memory card, is read by the filter initial setting unit 70, so that an optimal filter coefficient can be obtained. Also, by communicating with a predetermined server through a communication medium such as the Internet, the filter initial setting unit 70 can obtain an optimal filter coefficient. By performing initial-value setting according to method (2) or (3), the initial value close to an ideal filter coefficient can be easily set.

Third Embodiment

Figure 14:
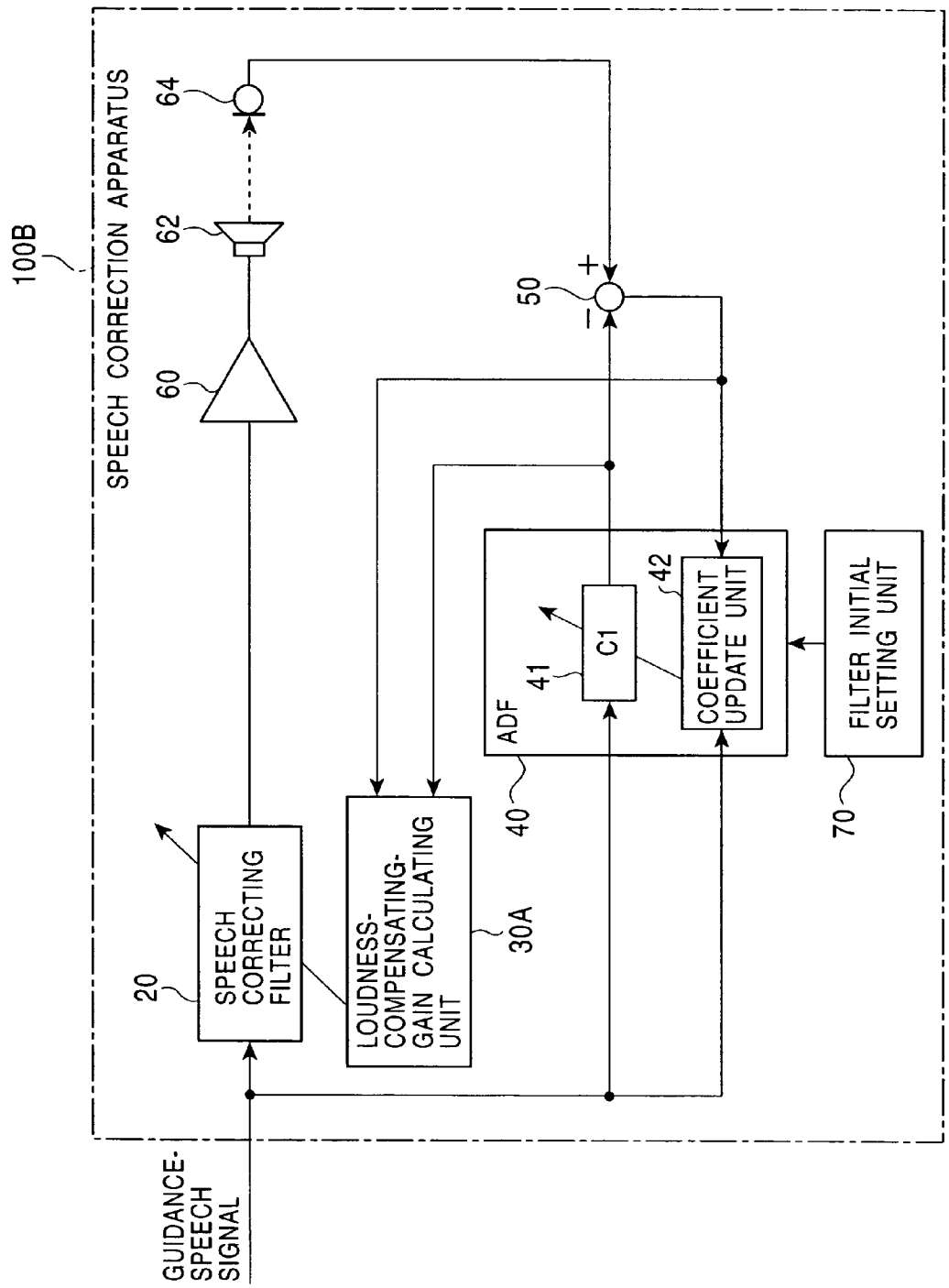
FIG. 14 shows the entire configuration of a speech correction apparatus according to a third embodiment.

FIG. 14 shows the entire configuration of a speech correction apparatus 100B of a third embodiment. As shown in FIG. 14, the speech correction apparatus 100B of this embodiment includes the speech correcting filter 20, a loudness-compensating-gain calculating unit 30A, the adaptive filter 40, the operating unit 50, the amplifier 60, the speaker 62, the microphone 64, and the filter initial setting unit 70.

In the speech correction apparatus 100A shown in FIG. 13, the speech-head correcting unit 90 is provided for suppressing an effect caused by a state where the window length Ln for calculating the average power of the noise is shorter than the window length Ls for calculating the average power of the guidance speech, as in the speech correction apparatus 100 shown in FIG. 1. On the other hand, in the speech correction apparatus 100B of this embodiment, the window lengths Ls and Ln for calculating each average power is set at the same value by the loudness-compensating-gain calculating unit 30A, and the speech-head correcting unit 90 is omitted accordingly.

The effect generated by setting the initial value of the filter coefficient performed by the above-described filter initial setting unit 70 is effective regardless of the existence of the speech-head correcting unit 90, and thus an excessive correction caused when a guidance-speech signal is supplied to the adaptive filter 40 in the initial state just after power-on can be suppressed.

What is claimed is:

1. A speech correction apparatus comprising:
a speaker for generating speech to be corrected;
a microphone set at a hearing position;
a signal separating unit for separating ambient noise from the speech to be corrected at the hearing position;
a speech correcting unit for correcting a sound pressure level of the speech to be corrected generated by the speaker based on an average power of the speech to be corrected and an average power of the ambient noise, which are separated by the signal separating unit; and
a speech-head correcting unit for correcting an average power of a speech-head at the border between a silent state and a speech state in the speech to be corrected, wherein the average power of the speech-head is corrected based on a comparison between a time length Ls for calculating the average power of the speech to be corrected and a time length Ln for calculating the average power of the ambient noise.

2. A speech correction apparatus according to claim 1, wherein the time length Ls for calculating the average power of the speech to be corrected is longer than the time length Ln for calculating the average power of the ambient noise.

3. A speech correction apparatus according to claim 2, wherein the speech-head correcting unit multiplies the average power of the speech to be corrected by Ls/Ln for the time length Ln just after shifting from the silent state to the speech state at the speech head.

4. A speech correction apparatus according to claim 3, wherein the speech-head correcting unit sequentially reduces the correction amount of the average power of the speech to be corrected after the time length Ln has passed until the time length Ls passes, with the border between the silent state and the speech state at the speech head being the reference.

5. A speech correction apparatus according to claim 1, wherein the signal separating unit comprises:
a filter having an acoustic characteristic as an impulse response of an acoustic system between the speaker and the microphone; and
an operating unit for subtracting a signal which is obtained by passing a signal supplied to the speaker according to the speech to be corrected through the filter from a signal received from the microphone when the speech to be corrected is generated by the speaker,
wherein a signal corresponding to the speech to be corrected is supplied by the filter and a signal corresponding to the ambient noise is supplied from the operating unit, so that the ambient noise is separated from the speech to be corrected at the hearing position;
the speech correction apparatus further comprising:
a coefficient update unit for updating a filter coefficient of the filter so that the power of the signal supplied from the operating unit is minimized; and
a filter initial setting unit for setting an initial value of the filter coefficient, which is updated by the coefficient update unit, at a value other than 0.

6. A speech correction apparatus according to claim 5, wherein the initial value set by the filter initial setting unit is a filter coefficient corresponding to a representative car model, which is determined based on the statistical number of cars for sale.

7. A speech correction apparatus according to claim 5, wherein the initial value set by the filter initial setting unit is a filter coefficient selected from among filter coefficients corresponding to a plurality of typical car models.

8. A speech correction apparatus according to claim 5, wherein the initial value set by the filter initial setting unit is a filter coefficient which corresponds to the model of a car carrying the apparatus.

9. A speech correction apparatus according to claim 5, wherein the speech correcting unit corrects the sound pressure level for each of a plurality of frequency bands.

10. A speech correction apparatus according to claim 5, wherein the speech correcting unit includes a gain table used for obtaining a corresponding correcting gain when specifying the sound pressure level of the ambient noise and a desired sound pressure level in audibility of the speech generated by the speaker for each of the plurality of frequency bands, and corrects the sound pressure level by referring to the gain table.

11. A speech correction apparatus comprising:
a speaker for generating speech to be corrected;
a microphone set at a hearing position;
a signal separating unit for separating ambient noise from the speech to be corrected at the hearing position;
a speech correcting unit for correcting a sound pressure level of the speech to be corrected generated by from the speaker based on an average power of the speech to be corrected and an average power of the ambient noise, which are separated by the signal separating unit; and
a speech-head correcting unit for stopping correction of the sound pressure level which is performed by the speech correcting unit in accordance with a speech-head at the border between a silent state and a speech state in the speech to be corrected, wherein the correction of the sound pressure level is stopped based on a comparison between a time length Ls for calculating the average power of the speech to be corrected and a time length Ln for calculating the average power of the ambient noise.

12. A speech correction apparatus according to claim 11, wherein the time length Ls for calculating the average power of the speech to be corrected is longer than the time length Ln for calculating the average power of the ambient noise.

13. A speech correction apparatus according to claim 12, wherein the signal separating unit comprises:
a filter having an acoustic characteristic as an impulse response of an acoustic system between the speaker and the microphone; and
an operating unit for subtracting a signal which is obtained by passing a signal supplied to the speaker according to the speech to be corrected through the filter from a signal received from the microphone when the speech to be corrected is generated by the speaker,
wherein a signal corresponding to the speech to be corrected is supplied by the filter and a signal corresponding to the ambient noise is supplied from the operating unit.

14. A speech correction apparatus according to claim 13, further comprising an identifying unit for identifying the acoustic characteristic of the filter.

15. A speech correction apparatus according to claim 14, wherein the identifying unit is a coefficient update unit for updating a filter coefficient of the filter so that the power of the signal supplied from the operating unit is minimized, and
the apparatus further comprises a filter initial setting unit for setting an initial value of the filter coefficient, which is updated by the coefficient update unit, at a value other than 0.

16. A speech correction apparatus comprising:
a speaker for generating speech to be corrected;
a microphone set at a hearing position;
a signal separating unit comprising:
a filter having an acoustic characteristic as an impulse response of an acoustic system between the speaker and the microphone; and
an operating unit for subtracting a signal which is obtained by passing a signal supplied to the speaker according to the speech to be corrected through the filter from a signal received from the microphone when the speech to be corrected is generated by the speaker,
wherein a signal corresponding to the speech to be corrected is supplied by the filter and a signal corresponding to the ambient noise is supplied from the operating unit, so that the ambient noise is separated from the speech to be corrected at the hearing position;
a coefficient update unit for updating a filter coefficient of the filter so that the power of the signal supplied from the operating unit is minimized;
a filter initial setting unit for setting an initial value of the filter coefficient, which is updated by the coefficient update unit, at a value other than 0; and
a speech correcting unit for correcting a sound pressure level of the speech to be corrected generated by the speaker based on a comparison between a time length Ls for calculating an average power of the speech to be corrected and a time length Ln for calculating an average power of the ambient noise, which are separated by the signal separating unit.

17. A speech correction apparatus according to claim 16, wherein the initial value set by the filter initial setting unit is a filter coefficient corresponding to a representative car model, which is determined based on the statistical number of cars for sale.

18. A speech correction apparatus according to claim 16, wherein the initial value set by the filter initial setting unit is a filter coefficient selected from among filter coefficients corresponding to a plurality of typical car models.

19. A speech correction apparatus according to claim 16, wherein the initial value set by the filter initial setting unit is a filter coefficient which corresponds to the model of a car carrying the apparatus.

20. A speech correction apparatus according to claim 16, wherein the speech correcting unit corrects the sound pressure level for each of a plurality of frequency bands.

21. A speech correction apparatus according to claim 16, wherein the speech correcting unit includes a gain table used for obtaining a corresponding correcting gain when specifying the sound pressure level of the ambient noise and a desired sound pressure level in audibility of the speech generated by the speaker for each of the plurality of frequency bands, and corrects the sound pressure level by referring to the gain table.

22. A speech correcting method for a speech correction apparatus comprising:
a speaker for generating speech to be corrected;
a microphone set at a hearing position;
a filter having an acoustic characteristic as an impulse response of an acoustic system between the speaker and the microphone; and
an operating unit for subtracting a signal which is obtained by passing a signal supplied to the speaker according to the speech to be corrected through the filter from a signal received from the microphone when the speech to be corrected is generated by the speaker,
the speech correcting method comprising:
an act of separating, by a signal separating unit, the ambient noise from the speech to be corrected at the hearing position by supplying a signal corresponding to the speech to be corrected from the filter and supplying a signal corresponding to the ambient noise from the operating unit;
an act of updating, by a coefficient update unit, a filter coefficient of the filter so as to minimize the power of the signal supplied from the operating unit;
an act of setting an initial value of the filter coefficient, which is updated by the coefficient update unit, at a value other than 0 by a filter initial setting unit; and
an act of correcting a sound pressure level of the speech to be corrected generated by the speaker based on a comparison between a time length Ls for calculating an average power of the speech to be corrected and a time length Ln for calculating an average power of the ambient noise, which are separated by the signal separating unit, the correction being performed by a speech correcting unit.

23. A speech correcting method according to claim 22, wherein the initial value set by the filter initial setting unit is a filter coefficient corresponding to a representative car model, which is determined based on the statistical number of cars for sale.

24. A speech correcting method according to claim 22, wherein the initial value set by the filter initial setting unit is a filter coefficient selected from among filter coefficients corresponding to a plurality of typical car models.

25. A speech correcting method according to claim 22, wherein the initial value set by the filter initial setting unit is a filter coefficient which corresponds to the model of a car carrying the apparatus.

26. A speech correcting method according to claim 22, wherein the speech correcting unit includes a gain table used for obtaining a corresponding correcting gain when specifying the sound pressure level of the ambient noise and a desired sound pressure level in audibility of the speech generated by the speaker for each of a plurality of frequency bands, and the method further comprises an act of correcting the sound pressure level by referring to the gain table.

* * * * *